United States Patent [19]

Watanabe et al.

[11] Patent Number: 4,774,690

[45] Date of Patent: Sep. 27, 1988

[54] OUTPUT BUFFER CIRCUIT

[75] Inventors: Kazuo Watanabe; Yoshinori Sato, both of Kanagawa, Japan

[73] Assignee: Sony Corporation, Tokyo, Japan

[21] Appl. No.: 883,119

[22] Filed: Jul. 8, 1986

[30] Foreign Application Priority Data

Jul. 12, 1985 [JP] Japan .................... 60-153686

[51] Int. Cl.[4] ............................. G11C 13/00
[52] U.S. Cl. ........................... 365/181; 365/189; 365/149; 365/203; 307/530
[58] Field of Search ............. 365/181, 189, 203, 230, 365/149; 307/530

[56] References Cited

FOREIGN PATENT DOCUMENTS 0086090 2/1983 European Pat. Off. .

Primary Examiner—Terrell W. Fears
Attorney, Agent, or Firm—Ronald P. Kananen

[57] ABSTRACT

In an output buffer circuit for a memory including complementarily-connected P-channel and N-channel MOS transistors, a voltage is induced across the lead inductance whenever the load capacitance is charged or discharged through the lead inductance during the switching operation of the buffer circuit. This induced voltage changes the ground level or the supply voltage level, and results in a problem such that data signals read from the memory are distorted. To overcome this problem, one of the two MOS transistors through which an electric charge is charged or discharged is divided into two MOS transistors of a small size, and the data signal is applied to one of the divided MOS transistor directly and to the other thereof through a delay element so that the peak of the induced voltage is lowered without increasing the access time of the memory.

16 Claims, 6 Drawing Sheets

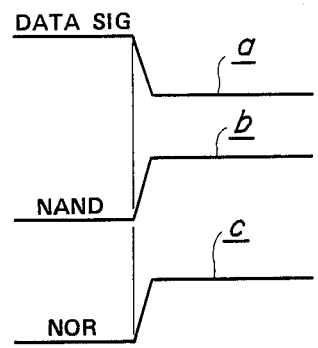
FIG. 3 A
FIG. 3 B
FIG. 3 C
FIG. 3 D
FIG. 3 E
(Prior Art)
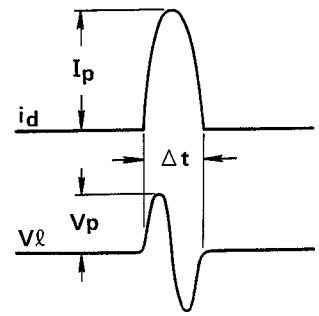
FIG. 4
(Prior Art)

FIG. 6A DATA SIG

FIG. 6B NAND

FIG. 6C 1ST NOR

FIG. 6D 2ND NOR

FIG. 6H $V_\ell$

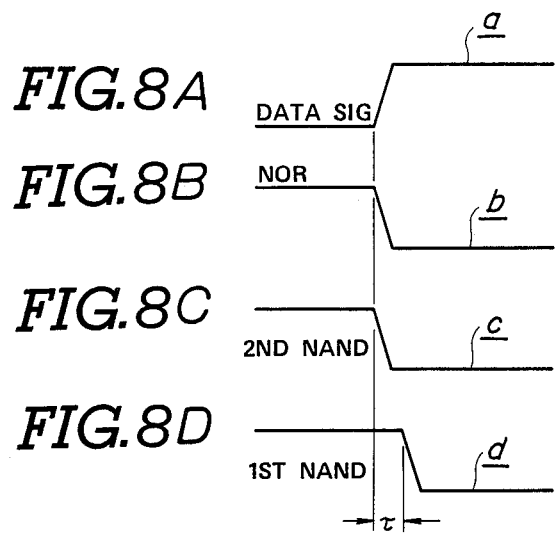
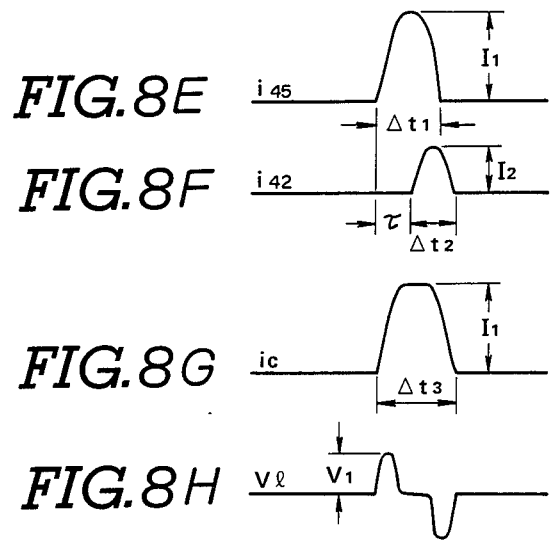

OUTPUT BUFFER CIRCUIT

BACKGROUND OF THE INVENTION

1. Field of the Invention

The present invention relates to an output buffer circuit and more specifically to an output buffer circuit for a memory. More specifically, this invention relates to an output buffer circuit for a memory wherein one of a pair of complementarily-connected MOS transistors is divided into two smaller-sized MOS transistors so that the load capacitance is discharged during switching through two paths through the divided MOS transistors, one of which is delayed relative to the other.

2. Description of the Prior Art

Conventionally, an MOS memory is widely used as a storage device of an electronic computer. An MOS memory has a great number of memory cells made up of MOS transistors which are arranged to form a memory matrix. Information is written into or read from the memory matrix in accordance with any selected addresses. To read any given information from the above-mentioned memory cells, predetermined addresses are selected by a selector and the data are read through an output buffer circuit under control of a read/write control circuit. The output buffer circuit outputs data signals in accordance with a control signal such as an output disable signal applied to the output buffer circuit through a logic circuit.

In the above-mentioned output buffer circuit, the data signal and the output disable signal are applied to each of the gates of a pair of complementarily-connected P-channel and N-channel MOS transistors through the logic circuit and the data signal is outputted from an intermediate junction point between the two drains of the MOS transistors. The source of one of the two MOS transistors is connected to a power supply and the source of the other of the two MOS transistors is connected to ground through a lead inductance caused by the aluminum wires and/or the bonding wires within a semiconductor chip and/or the lead wires of a lead frame. A load capacitance having a capacity determined in accordance with the MOS memory standard is connected to the output terminal thereof. When the load capacitance is charged or discharged through the lead inductance during the switching operation of the buffer circuit, an induced voltage is inevitably generated across the lead inductance. This induced voltage changes the potential of the reference voltage of the other circuits connected to the memory matrix. In particular, when several output buffer circuits are incorporated within the memory unit, plural induced voltages are generated simultaneously to a high voltage such as several hundreds millivolts or more.

On the other hand, since the input levels of the control signals supplied to the other circuits are determined by the TTL level, the control signals are distorted or disturbed by the induced voltage. In this connection, it is possible to reduce the induced voltage by decreasing the size of the MOS transistor. However, this results in a serious problem such that the access time to the memory is lengthened.

The circuit configuration of the prior art output buffer circuit will be described in further detail hereinafter with reference to the attached drawings in the detailed description of the preferred embodiments.

SUMMARY OF THE INVENTION

With these problems in mind, therefore it is a primary object of the present invention to provide an output buffer circuit which can reduce the induced voltage developed across the lead inductance when the load capacitance is charged or discharged during the switching operation of the buffer circuit.

To achieve the above-mentioned object, in the output buffer circuit including a are P-channel MOS transistor and an N-channel MOS transistor complementarily-connected in such a way that a data signal read from the memory unit is applied in common to each of the gates of the two MOS transistors selectively in response to a combination of the data signal and an output disable signal through plural logical elements. The data signal is outputted from an intermediate junction point between the two drains of the two MOS transistors. The present invention is characterized in that (a) either of the two P-channel and N-channel MOS transistors through which an electric charge of a load capacitance connected to the intermediate junction point is charged or discharged is divided into two first and second MOS transistors each having a small size and that (b) the data signal is selectively applied to a gate of the first divided MOS transistor directly and to a gate of the second divided MOS transistor through a delay circuit.

In the circuit configuration according to the present invention, since the current discharged from the load capacitance to the lead inductance or charged vice versa is divided into two routes in a time-delayed relationship between the two, it is possible to reduce the peak value and the rising slope of the induced voltage without increasing the access time in the memory unit. Therefore, it is possible to effectively solve the problem such that the reference potential in the memory circuit is fluctuated due to the induced voltage across the lead inductance; that is, the data signal read from the memory unit is distorted in waveform.

BRIEF DESCRIPTION OF THE DRAWINGS

The features and advantages of an output buffer circuit for a memory unit according to the present invention over the above-mentioned prior art output buffer circuit will be more clearly appreciated from the following description of the preferred embodiments of the invention taken in conjunction with the accompanying drawings, in which like reference numerals designate the same or similar elements or sections throughout the figures thereof and in which:

FIG. 3 comprised of FIGS. 3A through 3E is a timing chart of various signals of the prior art output buffer circuit shown in FIG. 2;

FIG. 4 is a diagram showing the level of a voltage induced across a lead inductance in comparison with a supply voltage and TTL levels;

FIG. 8 made up of FIGS. 8A through 8H is a timing chart of various signals of the output circuit shown in FIG. 7.

DETAILED DESCRIPTION OF THE PREFERRED EMBODIMENTS

To facilitate an understanding of the present invention, reference will be made to a prior art memory unit and a prior art output buffer circuit incorporated with the memory unit with reference to the attached drawings.

Figure 1:
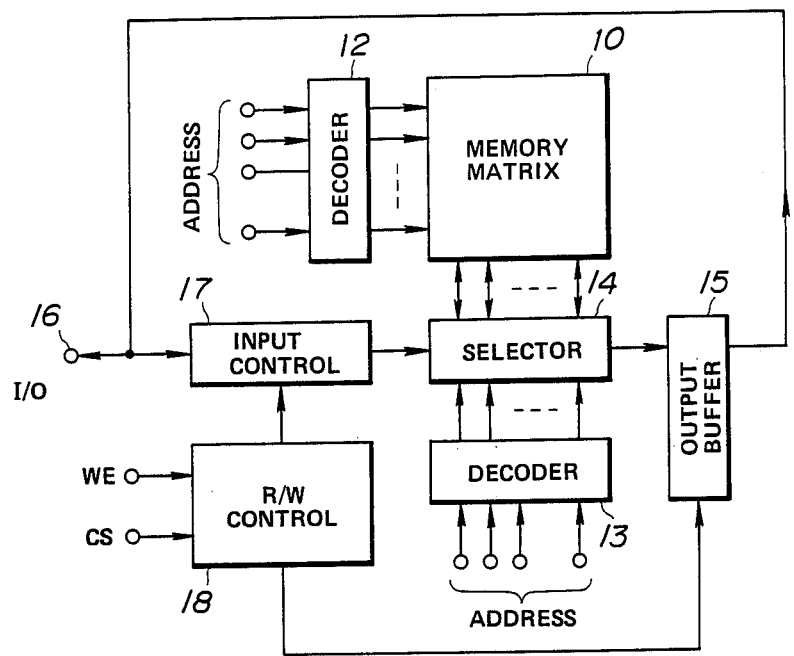
FIG. 1 is a schematic block diagram showing an example of system configurations of a MOS memory to which an output buffer circuit can be applied for assistance in explaining the present invention.

FIG. 1 shows a system configuration of a prior art memory unit. In FIG. 1, the reference number 10 denotes a memory matrix. When an address input is applied to decoders 12 and 13, a memory cell (not shown) at a predetermined address in the matrix 10 is selected by the two decoders 12 and 13 and a selector 14, and data written in the selected memory cell can be read from an input/output (1/0) terminal 16 through the selector 14 and an output buffer circuit 15. Further, an input control circuit 17 connected between the selector 14 and the input/output terminal 16 is controlled according to read/write (R/W) modes by a R/W control circuit 18 together with the output buffer circuit 15. Further, in FIG. 1, the symbol WE denotes a write enable signal, and the symbol CS denotes a chip select signal, both of which are applied to the R/W control circuit 18.

Figure 2:
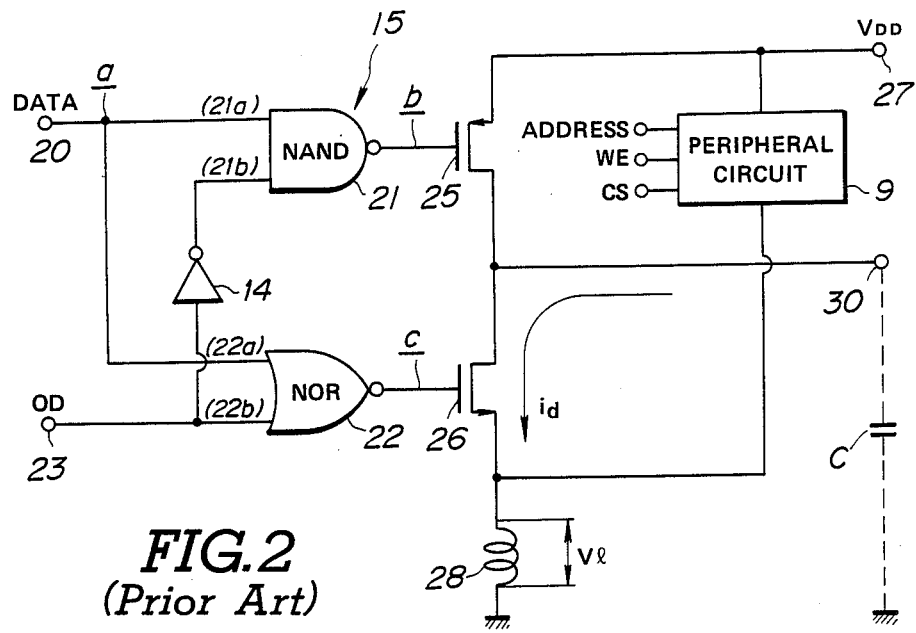
FIG. 2 is a schematic block diagram showing an example of prior art output buffer circuits.

FIG. 2 shows an example of the practical circuit configurations of the output buffer circuit 15.

As shown in FIG. 2, a data signal is supplied in common to one of the input terminals 21a of a NAND gate 21 and an input terminal 22a of a NOR gate 22 through a data input terminal 20. Further, a control signal or an output disable signal (referred to as an "OD signal" hereinafter) is supplied through a control signal input terminal 23 directly to the other input terminal 22b of the NOR gate 22 and indirectly to the other input terminal 21b of the NAND gate 21 by way of an inverter 24.

The output of the NAND gate 21 and the output of the NOR gate 22 are respectively applied to the gates of a P-channel MOS transistor 25 and an N-channel MOS transistor 26 which are complementarily connected to each other by connecting their respective drains. The source of the P-channel MOS transistor 25 is connected to a power supply terminal 27 while the source of the N-channel MOS transistor 26 is grounded through a lead inductance 28. The drains of the MOS transistors 25 and 26 are directly connected to each other, and an output terminal 30 is connected to an intermediate junction point between the commonly-connected drains. A capacitor C having a capacity determined in accordance with the MOS memory standard is connected to the output terminal 30. A plurality of the output buffer circuits 15 as shown in FIG. 2 are mounted on the memory according to the number of the output ports for the memory unit.

The lead inductance 28 is caused by aluminum wires and/or bonding wires within a semiconductor chip and/or lead wires of a lead frame. Further, a peripheral circuit 19, made up the two decoders 12 and 13, the selector 14, and the two control circuits 17 and 18 as shown in FIG. 1, is also grounded through the inductance 28.

The operation of the output buffer circuit 15 shown in FIG. 2 will be described below.

First, if the OD signal of the control signal input terminal 23 is at a logical "1" level, a logical "0" level of the output of the inverter 24 is applied to the other input 21b of the NAND gate 21, irrespective of the data signal applied to the input 21a of the NAND gate 21, the output of the NAND gate 21 is a logical "1", so that the P-channel MOS transistor 25 is turned off. At this time, since the other input 22b of the NOR gate 22 is also at a logical "1" level, irrespective of the data signal applied to the input 22a of the NOR gate 22, the output of the NOR gate 22 is at a logical "0" level, so that the N-channel MOS transistor 16 is also maintained in an off state. Therefore, when the OD signal is a logical "1", the output buffer circuit 15 shown in FIG. 2 will not operate.

As readily understood above, the NAND gate 21 and the NOR gate 22 are used to make the output buffer circuit 15 a try-state device.

Next, when the OD signal at the control signal input terminal 23 is at a logical "0" level, if the data signal at the input terminal 20 changes to a logical "1" or high level, since a logical "1" level at the output of the inverter 24 is applied to the other input terminal 21b of the NAND gate 21, the output of the NAND gate 21 is at a logical "0" level to turn on the P-channel MOS transistor 25. On the other hand, the logic signal at the input terminal 22a of the NOR gate 22 changes its output to a logical "0", or low level, to turn off the N-channel MOS transistor 26. Therefore, the output terminal 30 is connected to the power supply terminal 27 through the turned-on MOS transistor 25, so that the load capacitance C is charged up by a charge current flowing through the MOS transistor 25. Therefore, the terminal voltage at the output terminal 30 becomes equal to the power supply voltage $V_{DD}$ at the terminal 27.

In this state, as shown in FIG. 3A, if the data signal a at the input terminal 20 changes from a logical "1" to a logical "0", since the input 21a of the NAND gate 21 changes to a logical "0", the output b of the NAND gate 21 becomes a logical "1", as shown in FIG. 3B. On the other hand, since both inputs 22a and 22b to the NOR gate 22 change to a logical "0", the output c of the NOR gate 22 also changes to a logical "1" as shown in FIG. 3C. Therefore, the P-channel MOS transistor 25 is turned off and the N-channel MOS transistor 26 is turned on so that the electric charge of the load capacitance C is discharged through the N-channel MOS transistor 26 and the lead inductance 28.

Therefore, a voltage $V_l$ is induced across the lead inductance 28 having a magnitude L by the current $i_d$, as expressed by the following formula (1):

$$V_l = L \frac{d}{dt}(i_d) \tag{1}$$

As depicted in FIG. 3E, this induced voltage $V_l$ is positive on the leading edge side of the current $i_d$ shown in FIG. 3D to change the potential of the reference point or grounded line in the periphery circuit 19.

In a high speed memory, the on-time $\Delta t$ of the current $I_d$ should be reduced to as short a time as possible to an extent of several nanoseconds, for instance, in order to reduce the access time to as short a time as possible. Furthermore, where several output buffer circuits as shown in FIG. 2 are mounted on the memory, there exists a chance that all of the buffer circuits are simultaneously in the above-mentioned discharge state. Thus, the positive peak value $V_p$ of the induced voltage $V_I$ is unexpectedly high, for instance, to several hundreds of millivolts or more, for example.

On the other hand, since the input levels of the control signals supplied to the periphery circuit 19 such as an address input, write enable WE, chip select CS, and so forth, are determined by the TTL (Transistor Transistor Logic) level as shown in FIG. 4, if a high induced voltage V as described above changes the ground potential of the periphery circuit 19, the input voltage becomes apparently low on the Hi side of the TTL level, thus resulting in a problem in that the input voltage changes as if the address input changes. Then, an address transition detector (not shown) begins to operate to short or equalize the differential input terminals of a sense amplifier (not shown). Therefore, there exists a problem in that the waveform of a read data signal is distorted.

Since the on time $\Delta t$ of the current $i_d$ is determined by the load capacitance C and the driving capacity of the N-channel MOS transistor 26, it is possible to reduce the induced voltage $V_I$ when the current driving capacity can be reduced by decreasing the size of the MOS transistor 16, because the on time $\Delta t$ of the current $I_d$ is lengthened or increased. In this case, however, a serious problem will arise with a high-speed memory in that the access time to the memory is lengthened.

The influence of the ground side lead inductance at the time when the load capacitance C is discharged has been explained hereinabove. However, even when the load capacitance C is charged, the phenomenon described above will be produced by the lead inductance arranged on the power supply side, thus resulting in a problem that the induced voltage on the power supply line exerts a harmful influence upon the memory as noise.

In view of the above description, reference will now made to a first embodiment of the output buffer circuit for a memory unit according to the present invention.

Figure 5:
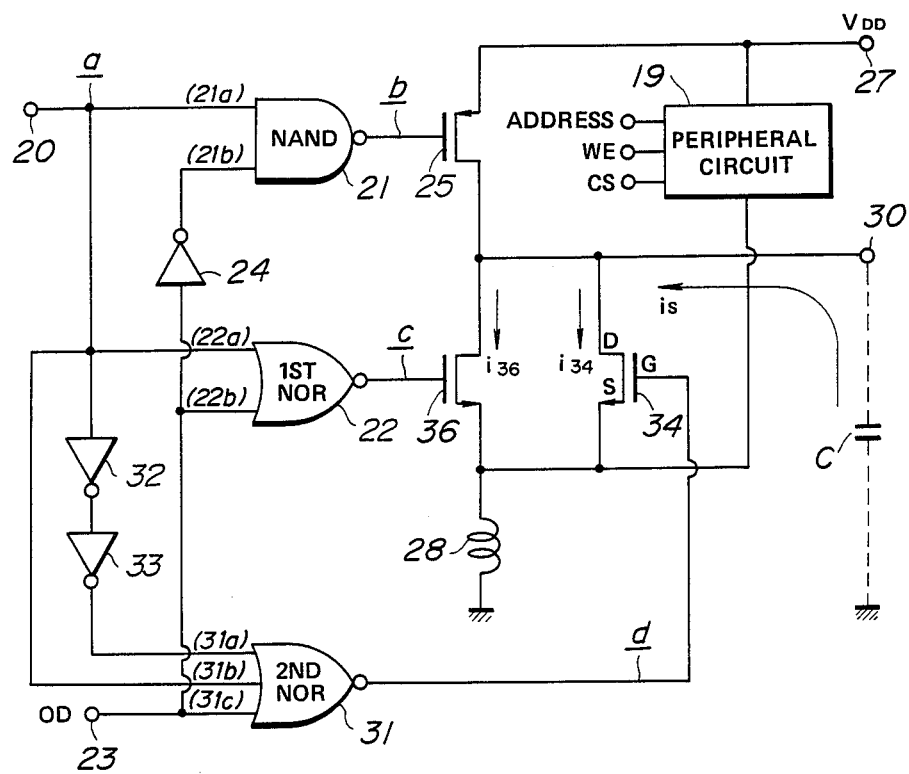
FIG. 5 is a schematic block diagram showing a first embodiment of the output buffer circuit according to the present invention.

FIG. 5 shows the circuit configuration of the first embodiment of the present invention. In FIG. 5, the same reference numerals have been retained for similar parts which have the same functions as described in connection with FIG. 2 so that a detailed description thereof is believed to be unnecessary.

In FIG. 5, a data signal from a data input terminal 20 is supplied to a first input terminal 31a of a second NOR gate 31 through two series-connected delay inverters 32 and 33 and directly to a second input terminal 31b of the second NOR gate 31. A third input terminal 31c of the NOR gate 31 is connected to the control signal input terminal 23. An output of the second NOR gate 31 is supplied to a gate of an N-channel MOS transistor 34. A drain and a source of the N-channel MOS transistor 34 are respectively connected to a drain and a source of an N-channel MOS transistor 36 which is connected in the same way as the N-channel MOS transistor 26 shown in FIG. 2. The relative sizes of the MOS transistors 34 and 36 are determined to be about 40% and 60% of the size of the MOS transistor 26 shown in FIG. 2. Thus, the N-type MOS transistor 26 of FIG. 2 is, in effect, replaced by the MOS transistors 36 and 34 of FIG. 5 to provide two discharge paths for the capacitor C, as will be explained in detail. The remaining parts other than those described above are the same as shown in the circuit shown in FIG. 2.

The embodiment of FIG. 5 operates as follows. First, when the OD signal of the control signal input terminal 23 is a logical "1", since the third input 31c of the second NOR gate 31 is a logical "1", the output of the second NOR gate 31 is a logical "0" irrespective of the logical state at the first and second inputs 31a and 31b, so that the N-channel MOS transistor 34 is turned off. At this time, since the MOS transistors 25 and 26 are off as previously described, this embodiment will not operate and its output is effectively disabled.

Next, when the OD signal of the control signal input terminal is a logical "0", if a data signal at the input terminal 20 changes to a logical "1", the second input 31b of the second NOR gate 31 changes to a logical "1" and therefore the output thereof is at a logical "0" state, so that the N-channel MOS transistor 34 is off. Therefore, the output terminal 30 is connected to the power supply terminal 27 through the turned-on MOS transistor 25, as described for these input conditions in FIG. 2, to charge the load capacitance C, so that the terminal voltage at the terminal 30 becomes equal to the power supply voltage $V_{DD}$ at the terminal 17.

Figure 6:
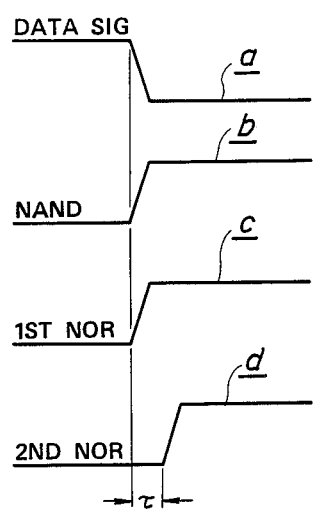
FIG. 6 composed of FIGS. 6A through 6H is a timing chart of various signals of the output buffer circuit shown in FIG. 5.

In this state, as shown in FIG. 6A, when a data signal a at the input terminal 20 changes from a logical "1" to a logical "0", the output b of the NAND gate 21 changes to a logical "1" as shown in FIG. 6B and the output c of the first NOR gate 22 also changes to a logical "1" as shown in FIG. 6C. Since the first input 31a of the second NOR gate 21 is inverted from a logical "1" to a logical "0" delayed by a predetermined delay time from the second input, that is, the data signal a shown in FIG. 6A by passing through the delay inverters 22 and 23, the output d of the second NOR gate 21 is inverted from a logical "0" to a logical "1" and is delayed by a time $\tau$ from the output c of the first NOR gate 12 (shown in FIG. 6C), as shown in FIG. 6D. In response to the inversion of the data signal a, the P-channel MOS transistor 15 is turned off and the N-channel MOS transistor 26 is turned on. Further, the N-channel MOS transistor 24 is turned after being delayed by the time $\tau$.

Therefore, the electric charge of the load capacitance C is passed first through the N-channel MOS transistor 36 of a 60% size, rising more gently than in the conventional circuit, as shown in FIG. 6E, and then discharged on the basis of a current $i_{36}$ having roughly the same on-time $\Delta_1$ and a lower peak value $I_1$ (FIG. 6E).

In response to the progress of the discharge started being delayed by a time $\tau$ from when the MOS transistor 36 starts to discharge, when the terminal voltage of the load capacitance C drops to some extent from that of the power supply voltage $V_{DD}$, a discharge begins on the basis of the current $I_{34}$ passing through the N-channel MOS transistor 34 of a 40% size, as shown in FIG. 6F. The current $i_{34}$ has a lower peak value $I_2$ and a shorter on-time $\Delta t_2$, as shown in FIG. 6F, compared to the current $I_{36}$ shown in FIG. 6E.

In this embodiment, since the total current $i_s$ flowing through the lead inductance 28 is the sum of the currents $i_{34}$ and $i_{36}$ flowing through both the MOS transistors 34 and 36, the total current $i_s$ has the same leading edge and the same peak value $I_1$ as those of the current $i_{36}$ of the 60% sized MOS transistor 36, as shown in FIG. 6G. Further, the magnitudes and the timings of the currents $i_{34}$ and $i_{36}$ are so determined that the current $i_s$ has an on-time $\Delta t_3$ which is a little longer than the on-time $\Delta t$ of the current $i_d$ in the conventional circuit. Furthermore, the integral of the currents $I_{34}$ and $i_{35}$ is equal to that of the current $i_d$ in the conventional circuit. In other words, the sizes of both the N-channel MOS transistors 34 and 36 are determined as described above and further the delay time of the inverters 32 and 33 is determined to be 2 nanoseconds for instance.

In the present invention, as described above, since the sizes of the MOS transistors 36 and 34 for passing the discharge current from the load capacitance C are divided into two paths and further either one of them is turned on after being delayed relative to the other by an appropriate time, it is possible to reduce the peak value $V_1$ of the induced voltage $V_l$ of the lead inductance 28 caused by the discharge current down to 75% of the conventional circuit while only lengthening its on-time a little. Thus, a harmful influence upon the access time is scarcely exerted.

Furthermore, in this first embodiment, since the integral of the discharge current $i_s$ is equal to that in the conventional circuit, it is possible to maintain the magnitude of the direct current component of the absorbing current at the same magnitude of the conventional circuit when the output signal is "Lo", thus preventing the operation stability from being deteriorated.

Figure 7:
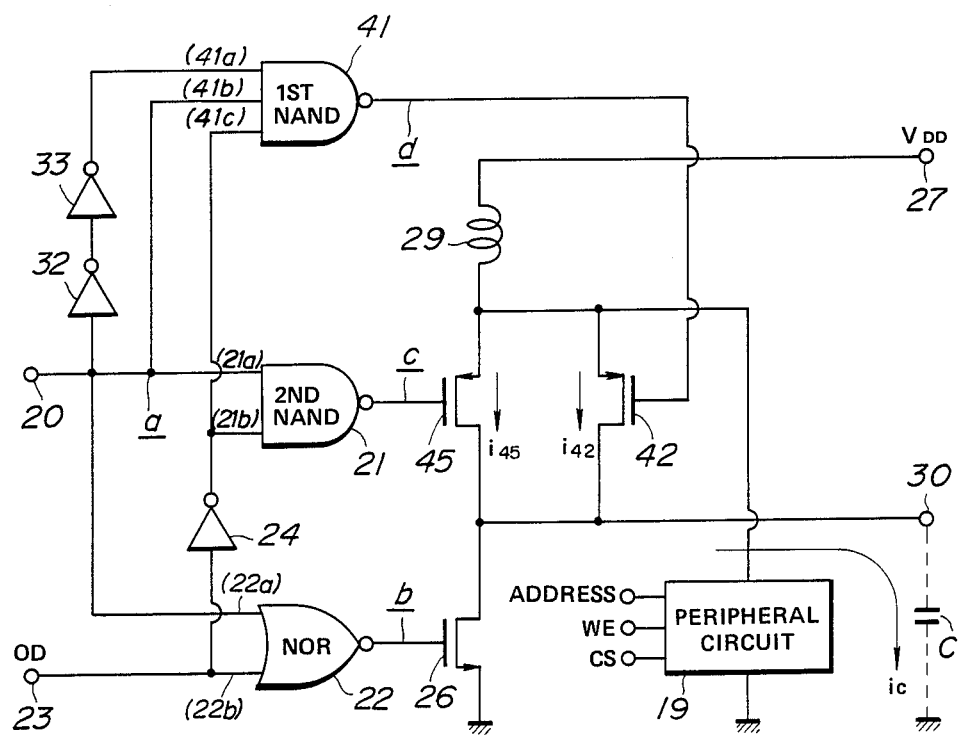
FIG. 7 is a schematic block diagram showing a second embodiment of the output buffer circuit according to the present invention.

With reference to FIGS. 7 and 8, another embodiment of the output buffer circuit for a memory according to the present invention will be described hereinbelow.

FIG. 7 shows the circuit configuration of the second embodiment of the present invention. In this FIG. 7, the same reference numerals have been retained for the similar parts which have the same functions as in FIG. 5 without repeating the description thereof.

In FIG. 7, a data signal is supplied from the data input terminal 20 to a first input terminal 41a of a first NAND gate 41 via two series-connected inverters 32 and 33 and further directly to a second input terminal 41b thereof of the NAND gate 41. A third input terminal 41c of the NAND gate 41 is connected to the control signal input terminal 23 via an inverter 24. The output of the first NAND gate 41 is supplied to the gate of the P-channel MOS transistor 42. The source of the MOS transistor 42 is connected to the power supply terminal 27 through the lead inductance 29 of the power supply line, together with the source of the P-channel MOS transistor 45 having the gate to which the output of the NAND gate 21 is supplied. Each of drains of both the MOS transistors 42 and 45 is connected to the drain of the N-channel MOS transistor 26 and the output terminal 30. The sizes of the P-channel MOS transistors 42 and 45 are determined to be about 40% and 60% of the size of the P-channel MOS transistor 25 shown in FIG. 3, as in the previous embodiment. Thus, the P-type MOS transistor 25 of FIG. 2 is, in effect, replaced by the MOS transistors 42c and 45 of FIG. 7 to provide two charge paths for the capacitor C, similar to FIG. 7, as will be explained in detail. The remaining configuration is the same as in the conventional circuit shown in FIG. 2.

The operation of this second embodiment is as follows: First, when the OD signal at the control signal input terminal 23 is a logical "1", since the third input 41c of the first NAND gate 41 is a logical "0", the output of the first NAND gate 41 is a logical "1" irrespective of the second input 41b, so that the P-channel MOS transistor 42 is turned off. At this moment, since the MOS transistors 26 and 45 are both off as already described, this circuit will not operate.

Next, when the data signal and the OD signal are both at a logical "0" at both the input terminals 20 and 23, since one input 21a of the second NAND gate 21 and the first and second inputs 41a and 41b of the first NAND gate 41 are a logical "0", the outputs of both the NAND gates 21 and 41 are both a logical "1", so that both of the P-channel MOS transistors 42 and 45 are turned off. On the other hand, since both of the inputs 22a and 22b of the NOR gate 22 are a logical "0", the output of the NOR gate 22 is a logical "1", so that the N-channel MOS transistor 26 is turned off. Therefore, the electric charge of the load capacitance C is discharged through the MOS transistor 26, so that the terminal voltage of the load capacitance C drops to 0.

Under these conditions, when the data signal a changes from a logical "0" a logical to "1" as shown in FIG. 8A, the output b of the first NOR gate 22 changes from a logical "1" to a logical "0" as shown in FIG. 8B, so that the N-channel MOS transistor 26 is turned off. At the same time, the output c of the second NAND gate 21 changes to a logical "0" as shown in FIG. 8C, so that the P-channel MOS transistor 45 is turned on. As shown in FIG. 8D, the first input 41a of the first NAND gate 41 changes to a logical "1" being delayed by time $\tau$ from the leading edge of the data signal a. Simultaneously, the output d of the first NAND gate 41 changes to a logical "0", so that the P-channel MOS transistor 42 is turned on.

In the same way as in the previous embodiment, the load capacitance C is first changed by the current $i_{45}$ flowing through the 60% sized P-channel MOS transistor 45, as shown in FIG. 8E. When the terminal voltage of the load capacitance C rises to a some extent, the load capacitance C is charged by the current $i_{42}$ flowing through the 40% sized P-channel MOS transistor 42, as shown in FIG. 8F. The face that the total charging current $i_c$ and the induced voltage at the power supply line have the same waveforms and the same effect as those of the total charging current $i_s$ and the induced voltage at the ground line of the first embodiment shown in FIG. 5, can readily be understood on the basis of the fact that only the polarity of the MOS transistors is different between both the embodiments, as depicted in FIGS. 8G and 8H.

Furthermore, it is possible to combine both the embodiments shown in FIGS. 5 and 7, to provide dual charging and discharging paths for the capacitor C in a output buffer memory.

As described above in detail, according to the present invention, since the path of the MOS transistors passing the charging and discharging currents of the load capacitance are appropriately divided into two paths and either one of the MOS transistors is turned on after being delayed relative to the others by an appropriate time, it is possible to obtain the output buffer circuit for a memory which reduces the induced voltage due to the charge/discharge current at the power supply line and the ground line without scarcely exerting a harmful influence upon the access time.

The invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

What is claimed:

1. An output buffer circuit comprising:

a pair of complementarily-connected switching means for receiving a data signal and an output disable signal at respective inputs of said pair of switching means through first and second logical circuits for providing the data signal from an intermediate junction point between output terminals of said pair of switching means for charging a load capacitance when at least one of said switching means is enabled wherein:

(a) either of said pair of complementarily-connected switching means comprises first and second switching means for discharging the load capacitance through parallel paths respectively defined by said first and second switching means, and (b) a delay means cooperating with at least one of the complementarily-connected switching means through a third logical circuit so that the data signal is applied to an input terminal of one of said first and second switching means and on a delayed basis to an input terminal of the other said first and second switching means, whereupon said load capacitance discharges through the parallel paths in a way that the discharge through one is delayed relative to the other in response to the delayed data signal and said output disable signal being applied through said third logical circuit to one of said first and second switching means.

2. An output buffer circuit including:
a complementarily-connected P-channel MOS transistor and an N-channel MOS transistor wherein a data signal is applied in common to a gate of each of said MOS transistors selectively in response to a combination of the data signal and an output disable signal through plural logical elements, the data signal being outputted from an intermediate junction point between drains of said MOS transistors to a load capacitance, wherein (a) either of said P-channel and N-channel MOS transistors through which an electric charge of said load capacitance is connected to the intermediate junction point is charged or discharged is divided into first and second MOS transistors, and (b) a delay circuit means connected to receive said data signal and with at least one of said divided MOS transistors so that the data signal is selectively applied to a gate of said first divided MOS transistor directly and to a gate of said second divided MOS transistor by at least one of said plural logical elements so that two discharge paths are provided for said load capacitance through said divided MOS transistors, discharge through one being delayed relative to the other.

3. An output buffer circuit which comprises:
(a) a first P-channel MOS transistor for charging a load capacitance connected to a drain thereof in response to a data signal and an output disable signal, both of which are applied to a gate thereof through a first logical circuit;
(b) a second N-channel MOS transistor complementarily-connected in series with said first P-channel MOS transistor for discharging the load capacitance in response to the data signal and the output disable signal, both of which are applied directly to a gate thereof through a second logical circuit;
(c) a delay inverter for delaying the data signal; and
(d) a third N-channel MOS transistor connected in parallel with said second N-channel MOS transistor for discharging the load capacitance in cooperation with said second N-channel MOS transistor in response to the delayed data signal through said delay element and the output disable signal, both of which are applied to a gate thereof through a third logical circuit.

4. An output buffer circuit for a memory unit which comprises:
(a) a first N-channel MOS transistor for discharging a load capacitance connected to a drain thereof in response to a data signal and an output disable signal, both of which are applied to a gate thereof through a first logical circuit;
(b) a second P-channel MOS transistor complementarily-connected in series with said first N-channel MOS transistor for charging the load capacitance in response to the data signal and the output disable signal, both of which are applied directly to a gate thereof through a second logical circuit;
(c) a delay inverter for delaying the data signal and;
(d) a third P-channel MOS transistor connected in parallel with said second P-channel MOS transistor for charging the load capacitance in cooperation with said second P-channel MOS transistor in response to the data signal delayed through said delay element and the output disable signal both applied to a gate thereof through a third logical circuit.

5. The output buffer circuit as set forth in claim 3, wherein said second N-channel MOS transistor is 60% in size and said third N-channel MOS transistor is 40% in size, compared to said first P-channel MOS transistor.

6. The output buffer circuit as set forth in claim 4, wherein said second P-channel MOS transistor is 60% in size and said third P-channel MOS transistor is 40% in size, compared to said first N-channel transistor.

7. In combination, an output buffer circuit comprising:
input means, including logic means, for selectively supplying a data signal and an output disable signal at an output thereof;
a pair of complementarily-connected switching means in circuit with said input means for providing an output data signal at an output of said switching means;
a load capacitance connected to said output of said switching means to be charged or discharged through one of said pair of switching means in response to said input means;
a delay means for receiving said data signal and providing a delayed data signal at the output thereof; and
one of said pair of switching means providing at least a pair of charging or discharging paths for said capacitance, each of said paths including an MOS transistor connected to said input means so that said data signal is applied directly to an input of one of said MOS transistors in one of said paths and through said delay means to an input of the other MOS transistor in the other of said paths in response to said logic means.

8. An output buffer circuit comprising:
a pair of complementarily-connected switching means for receiving a data signal at respective inputs of said pair of switching means and providing an output data signal at an output terminal connected to a common connection between said pair of switching means, characterized in that either of said pair of switching means comprises a first switching means and a second switching means and said data signal is respectively applied to an input of either of said first and said second switching means and through a delay means to an input of the other of said first and said second switching means, and wherein said pair of switching means includes a complementarily-connected P-channel MOS transistor and an N-channel MOS transistor, said data signal being applied in common to a gate of each of said two MOS transistors selectively in response to a combination of said data signal and an output disable signal through plural logical elements, said data signal being outputted through an intermediate junction point between drains of said MOS transistors, one of said first switching means and said second switching means respectively comprising first and second MOS transistors to provide a divided charge or discharge path for a load capacitance connected to an intermediate junction point between said pair of MOS transistors, said data signal being selectively applied to a gate of said first MOS transistor and through a delay circuit to a gate of said second divided MOS transistor.

9. An output buffer circuit comprising:

a pair of complementarily-connected switching means for receiving a data signal at respective inputs of said pair of switching means and providing an output data signal at an output terminal connected to a common connection between said pair of switching means, characterized in that either of said pair of switching means comprises a first switching means and a second switching means and said data signal is respectively applied to an input of either of said first and said second switching means and through a delay means to an input of the other of said first and said second switching means, and wherein one of said pair of complementarily-connected switching means comprises a first P-channel, MOS transistor for charging a load capacitance connected to a drain thereof in response to said data signal and an output disable signal, both of which are applied to a gate thereof through a first logical circuit; the other of said pair of complementarily-connected switching means comprising a second N-channel MOS transistor complementarily-connected in series with said first P-channel MOS transistor for discharging said load capacitance in response to the data signal and the output disable signal both of which are applied directly to a gate thereof through a second logical circuit; said delay means comprising a delay inverter for delaying the data signal, and further comprising:

a third N-channel MOS transistor connected in parallel with said second N-channel MOS transistor for discharging the load capacitance in cooperation with said second N-channel MOS transistor in response to the data signal delayed through said delay inverter and the output disable signal, both of which are applied to a gate thereof through a third logical circuit.

10. An output buffer circuit according to claims 8 or 9 wherein said pair of complementarily-connected switching means comprises a first N-channel MOS transistor for discharging a load capacitance connected to a drain thereof in response to a data signal and an output disable signal, both of which are applied to a gate thereof through a first logical circuit and a second P-channel MOS transistor complementarily-connected in series with said first N-channel MOS transistor for charging said load capacitance in response to the data signal and the output disable signal, both of which are applied directly to a gate thereof through a second logical circuit; and said delay means is a delay inverter for delaying the delay signal and wherein either of said first and or said second switching means comprising a third P-channel MOS transistor connected in parallel with said second P-channel MOS transistor for charging the load capacitance in cooperation with said second P-channel MOS transistor in response to the data signal delayed through said delay means and the output disable signal, both of which are applied to a gate thereof through a logical circuit.

11. An output buffer circuit as set forth in claims 8 or 9 wherein said first switching means and said second switching means are respectively about 60% in size and 40% in size of the other of said pair switching means.

12. An output buffer circuit as set forth in claims 8 or 9 wherein said first and said second switching means means respectively provide divided charging and discharging paths for a load capacitance connected to said output terminal.

13. An output buffer circuit as set forth in claims 8 or 9 wherein said first and said second switching means are N-channel MOS transistors for providing divided discharging paths for said load capacitor.

14. An output buffer circuit as set forth in claims 8 or 9 wherein said first and said second switching means are P-channel MOS transistors for providing divided charging paths for said load capacitor.

15. An output buffer circuit comprising:

a pair of complementarily-connected switching means for receiving a data signal at respective inputs of said pair of switching means for providing the data signal from an intermediate junction point between output terminals of said pair of switching means, wherein:

(a) either of said pair of complementarily-connected switching means comprises first and second switching means, and (b) a delay means cooperating with said switching means so that the data signal is applied to an input terminal of one of said first and second switching means and to an input terminal of the other said first and second switching means;

wherein said pair of switching means comprises a first P-channel MOS transistor and a second N-channel MOS transistor, said first and second switching means comprising said second N-channel MOS transistor and a third N-channel MOS transistor, said delay means including a delay inverter for delaying said data signal wherein:

the first P-channel MOS transistor is connected for charging a load capacitance connected to a drain thereof in response to a data signal and an output disable signal, both applied to a gate thereof through a first logic circuit;

the second N-channel MOS transistor is complementarily-connected in series with said first P-channel MOS transistor for discharging the load capacitance in response to the data signal and the output disable signal both applied directly to a gate thereof through a second logic circuit; and the third N-channel MOS transistor is connected in parallel with said second N-channel MOS transistor for discharging the load capacitance in cooperatioan with said second N-channel MOS transistors in response to the delayed data signal through said delay element and the output disable signal, both applied to a gate thereof through a third logic circuit.

16. An output buffer circuit comprising:

a pair of complementarily-connected switching means for receiving a data signal at respective inputs of said pair of switching means and providing an output data signal at an output terminal connected to a common connection between said pair of switching means, characterized in that either of said pair of switching means comprises a first switching means and a second switching means and said data signal is respectively applied to an input of either of said first and said second switching means and through a delay means to an input of the other of said first and said second switching means, and wherein said pair of switching means comprises a first N-channel MOS transistor and a second P-channel MOS transistor, said first and said second switching means comprising said second P-channel MOS transistor and a third P-channel MOS transistor, said delay means comprising a delay inverter for delaying the data signal, wherein:

(a) said first N-channel MOS transistor is connected for discharging a load capacitance connected for discharging a load capacitance connected to a drain thereof in response to a data signal and an output disable signal, both applied to a gate thereof through a first logic circuit;

(b) said second P-channel MOS transistor is complementarily-connected in series with first N-channel MOS transistor for charging the load capacitance in response to the data signal and the output disable signal, both applied directly to a gate thereof through a second logic circuit; and (c) said third P-channel MOS transistor connected in parallel with said second P-channel MOS transistor for charging the load capacitance in cooperation with said second P-channel MOS transistor in response to the data signal delayed through said delay element and the output disable signal, both applied to a gate thereof through a third logical circuit

* * * * *